United States Patent [19]
Holmqvist

[11] Patent Number: 5,220,275
[45] Date of Patent: * Jun. 15, 1993

[54] ACCUMULATOR PHASE DIGITIZER

[75] Inventor: Bo P. Holmqvist, Lund, Sweden

[73] Assignee: Ericsson GE Mobile Communication Holding, Inc., Paramus, N.J.

[*] Notice: The portion of the term of this patent subsequent to Jan. 28, 2009 has been disclaimed.

[21] Appl. No.: 736,430

[22] Filed: Jul. 26, 1991

[51] Int. Cl.$^5$ .............................................. G01R 23/10
[52] U.S. Cl. ............................ 324/76.82; 324/76.77; 328/133; 328/134; 307/516
[58] Field of Search .................... 331/1 A, 27, 25; 307/514, 516, 517, 518; 328/134, 133, 141, 155; 324/83 D, 83 R

[56] References Cited

U.S. PATENT DOCUMENTS

| | | |
|---|---|---|
| 3,590,381 | 6/1971 | Ragsdale . |
| 4,503,400 | 3/1985 | Edwards ................................ 331/27 |
| 4,504,799 | 3/1985 | Elmis ..................................... 331/27 |
| 4,620,160 | 10/1986 | Waggener . |
| 4,675,882 | 6/1987 | Lillie et al. . |
| 4,754,259 | 6/1988 | Joseph et al. . |
| 4,820,993 | 4/1989 | Cohen .................................. 331/1 A |
| 4,876,699 | 10/1989 | Nelson . |
| 4,879,527 | 11/1989 | Geile .................................... 331/1 A |
| 4,887,044 | 12/1989 | Inoue . |
| 4,985,684 | 1/1991 | Jentz et al. . |
| 5,066,927 | 11/1991 | Dent ..................................... 331/1 A |
| 5,081,655 | 1/1992 | Long .................................... 331/1 A |
| 5,084,669 | 1/1992 | Dent ..................................... 324/83 D |

FOREIGN PATENT DOCUMENTS 0434355 6/1991 European Pat. Off. .

Primary Examiner—Kenneth A. Wieder
Assistant Examiner—Jose M. Solis
Attorney, Agent, or Firm—Burns, Doane, Swecker & Mathis

[57] ABSTRACT

In a phase digitizer for converting phase information of an analog signal into a digital representation, a phase accumulator stores incremental phase angle values of a reference signal. A trigger circuit which is responsive to an input signal and a sample signal generates a strobe signal which causes the incremental phase angle value stored in the phase accumulator to be transferred to a holding latch. The value of the holding latch is then transferred to an output latch which provides a digital representation of the phase angle of the input signal.

7 Claims, 8 Drawing Sheets

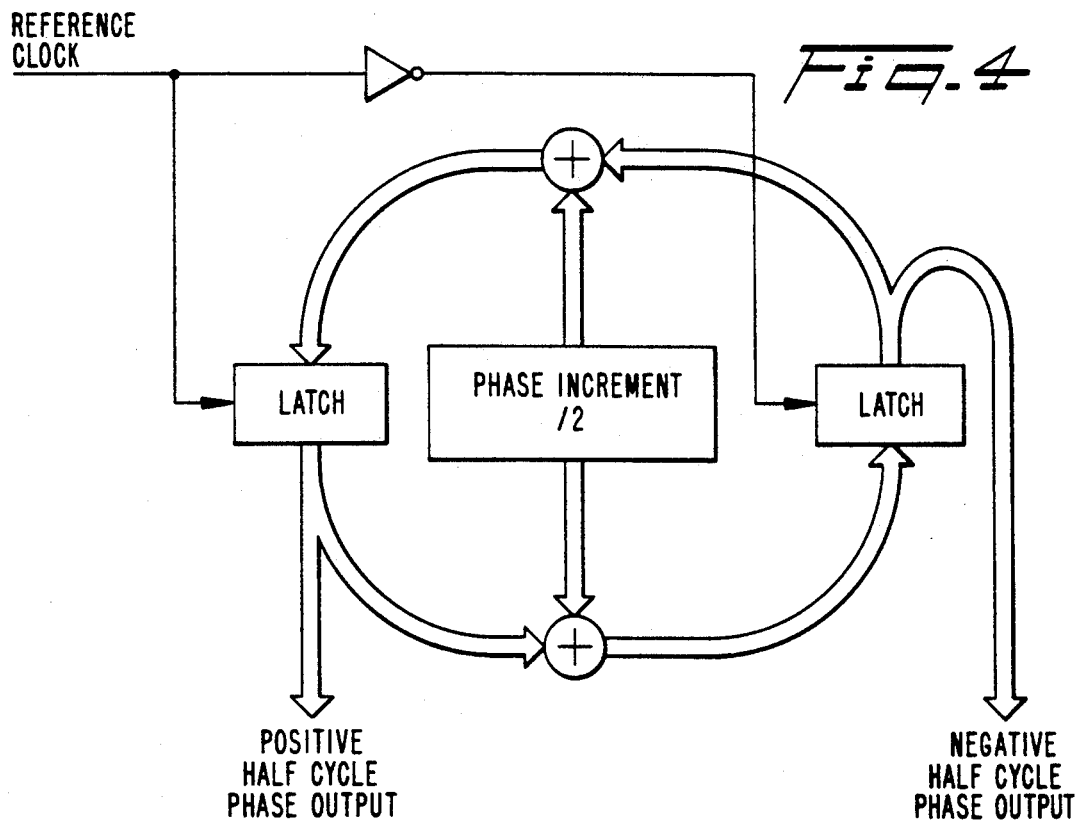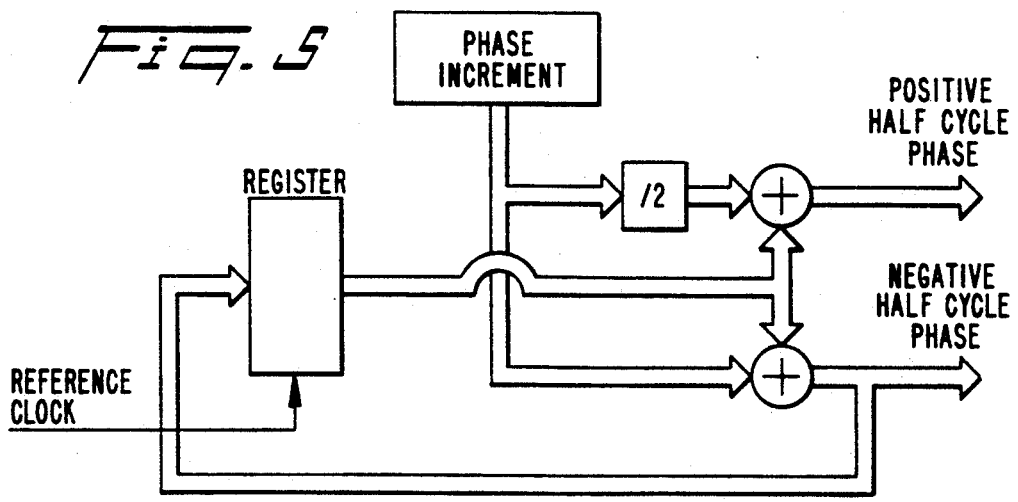

ACCUMULATOR PHASE DIGITIZER

FIELD OF THE INVENTION

The present invention relates to the conversion of an input signal having phase information into a digital representation, and more specifically relates to a circuit for digitizing phase information.

BACKGROUND OF THE INVENTION

In many electronic applications it would be an advantage if the instantaneous phase angle of an A.C. electrical signal was available directly in a digital representation. The digital representation is especially useful if subsequent numerical processing of the signal is to take place. Today, several special chips for digital signal processing are available, and processing the signal digitally provides many advantages over ordinary analog signal processing. For example, digital filters do not suffer from the component value spread associated with analog filters, and a designer can implement more complex algorithms when using digital techniques.

One use of the digital phase representation of a signal would be to demodulate digitally a phase modulated radio signal. If all subsequent filtering of the signal were also to be done digitally, such a technique would obviate the need for analog components in the radio receiver, except for the digital-to-analog converter and the radio frequency portions. It would also be possible to demodulate a frequency modulated signal, since the frequency is the derivative of the phase. The frequency, therefore, can be calculated by differentiating the phase samples using a simple digital subtraction.

Since the phase of a constant frequency signal forms a continuously incrementing ramp, the true phase representation of the signal occupies an infinite number of binary bits. The solution to this problem is to represent the phase as modulo 2Pi. If, for example, an eight bit binary word is chosen to represent the phase, then a circular phase angle in the range 0 . . . 2Pi can be mapped to match exactly the circular domain, or Galois field, of a binary word in the range 0 . . . 256. This mapping of one circular domain onto the other greatly simplifies the numerical processing.

There are several known methods of digitizing the phase of an analog A.C. input signal. One method is to use an analog phase comparator which is fed with an input signal together with a reference signal. The output of the comparator is then fed to an analog-to-digital converter that provides the desired digital representation. This method requires (1) the phase comparator to be very linear and (2) the output phase-to-voltage conversion factor from the comparator to match exactly the voltage to code conversion factor of the analog-to-digital convertor. If these two requirements are not satisfied, then an error in the mapping of one circular domain onto the other will occur. This error can be amplified in the numerical processing of the signal, for example, when differentiating the phase in order to demodulate a frequency modulated signal. Another drawback of this method is that the method cannot be implemented using only digital logic components.

Another method, that is very closely related to the method described above, is to use a frequency discriminator with an analog-to-digital converter instead of the phase comparator, and then the phase is re-integrated from the frequency samples. The phase obtained with this method will, of course, only be an estimate of the actual phase.

Still another method includes quadrature phase detectors, which is often referred to as the I,Q method. There are a limited number of phase comparators that can operate correctly with a noisy signal in the entire range 0 to 2Pi. It is particularly difficult for the comparator when the phase is in the area of 2Pi or 0, where the circular phase wraps around. The I,Q method uses two phase comparators, instead of one, and each comparator is fed with a reference signal that is offset by 90 degrees with respect to the other. At least one of the two comparators will operate well away from the discontinuity.

A method often used in commercial frequency counters is the digital counter-discriminator. The number of input signal cycles that occur during a fixed time interval is counted, and the count is used as a measurement of the frequency. In order to obtain an acceptable accuracy in the frequency, the time interval has to be substantially longer than the input signal cycle period. For example if 1% accuracy is required, then the measurement period must be at least 100 times the signal period. Accordingly, a measurement obtained using this method is an average measurement. The frequency samples then have to be reintegrated, if a phase output is desired.

Another method that is commonly used in frequency counters is to measure the period of the input signal. The frequency can then be calculated as the reciprocal of the period time. The time measurement can be implemented very easily using a counter that is reset on the first input signal edge and then read on the next. In order to obtain a high resolution measurement, the clock frequency of the counter has to be substantially higher than the input signal frequency. Another drawback of this method is that the signal is sampled on the edge of the input signal, i.e., the so-called natural sampling. It is, however, often preferable to sample and digitize a signal at regular intervals that are independent of a noisy or varying signal.

A better method of digitizing the phase is described in copending U.S. Pat. No. 5,084,669, entitled "Direct Phase Digitization", by Paul Dent, and assigned to the assignee of the present application. This improved method reads the position of a rotating reference phase vector on the edges of the input signal and uses the vector angle as the phase sample. FIG. 1 shows a simplified block diagram of the phase digitizing device 10 of the copending application. The main blocks of the digitizer 10 are the counter 11, the latches 12 and 13, and the trigger circuit 14. Assume for the present that a reference clock frequency is available which is an integer multiple, preferably binary, of the input signal frequency. The reference clock is applied to the digital counter 11 which divides by the predetermined multiple so that a divider count cycle repeats at the same rate as the expected input frequency. The state of the counter 11 can then be thought of as a phase vector angle that turn exactly one revolution for every unmodulated input signal period. An output value is produced by recording the state of the counter 11, the vector angle, on zero-crossing events of the input signal. In contrast to the other methods described, the counter 11 is never reset and continues to increment between measurements. The recording of the counter state is caused by a trigger signal which is a function of two events. Firstly, the trigger circuit 14 must be armed by receipt of a sampling pulse which indicates that it is desired to make a measurement. Secondly, the trigger circuit 14 fires on the next occurrence of a input signal zero-crossing. The pulse that the trigger circuit 14 generates when it fires causes the state of the counter 11 to be transferred to the intermediate holding register or latch 12. The result is held in the latch 12 until the next sampling pulse is applied to the trigger circuit 14. The result is then transferred to the output latch 1 before it is replaced by the next measurement. Measurements, therefore, occur at the output register or latch 13 with a one sample delay and at a regular rate determined by the externally applied sampling signal. An extra bit of precision may be obtained by extending the holding register 12 by one bit and also recording whether the reference clock signal at the trigger firing was on a positive or negative half cycle.

Since the input signal edge which latches the counter state can occur at any time relative to the reference clock edge, it is desirable that the counter 11 be of the Gray code type or some other suitable type. In a Gray code counter only one bit changes on adjacent clock cycles, thus avoiding the danger of erroneous results due to several bits changing at slightly different times. If a Gray code counter is used, it may be convenient to insert a Gray code to binary converter between the holding register 12 and the output register 13.

If the expected input signal frequency is exactly equal to the counter divider repetition cycle rate, the zero crossings will always occur at the same counter state, which depends on the arbitrary phase of the signal relative to the master clock. For example, assuming that the counter 11 divides by 64, the sequence of numbers produced may be 29, 29, 29 . . . If the expected signal frequency is lower than the counter repetition rate, the zero crossings will occur on progressively later counter states. For example, 60, 62, 0, 1, 3 . . . , the counter wrapping around at 64. The exact expected number of increments between the samples in this example is 64 times the frequency offset times the sample period. For example, if the expected signal frequency is 1000 Hz lower than the counter repetition rate, and the sampling frequency is 256 Hz, then the expected increment between samples will be 64*1000/256 modulo 64=3 29/32nds.

The above-described example has been chosen such that the expected increment is not an integer in order to illustrate that the cumulative increment can still be predicted by extending the precision to the right of an imagined binary point to represent the fractional part. In the above-described example, a binary accumulator (not shown) with five bits to the right of the decimal point to represent numbers in steps of 1/32nd. The accumulator would then be incremented after every sample by the digital value 000011.11101 representing 3 29/32.

The value in the binary accumulator represents the systematic phase offset a signal at exactly the specified nominal frequency would have accumulated up to this point due to frequency offset from the reference counter's 11 repetition rate. The increment to the binary accumulator represents the extra phase rotation added every time due to the systematic frequency offset integrated over a sampling interval. By subtracting the accumulated phase offset from the phase measurement before transferring it to the output register 13, it is corrected for both the systematic frequency error and the non-commensurate sampling rate. It, therefore, becomes possible to choose the signal center frequency, the reference frequency and the sampling rate independently of each other, within reasonable practical limits.

The main drawback with the above-described reference vector method of phase digitization relates to the correction of the measurement. For certain combinations of input, reference and sampling signal frequencies the correction may generate a tone that will interfere with the phase information. For example, if a 2 MHz reference clock is fed to a modulo 64 counter, the nominal signal frequency is 34 kHz and the sample frequency is 16 kHz. The correction increment, therefore, would exactly be 64*(2 Mhz/64−34 kHz)/16 kHz=−11.

Consecutive output samples will then be corrected by adding 11, 22, 33, 44, 55, 2, 12 . . . to the measurements. This correction completely compensates for the average frequency offset, however, every measurement is made on the zero crossing of the input signal not on the sampling pulse. There is exactly 34 kHz/16 kHz=2 1/8 signal periods for every sample pulse period. This means that seven times out of eight the measurements are taken every second signal zero crossing, but the eighth measurement is taken after three zero crossings. Since the actual time between measurements is shorter than the sample period for the first seven measurements, these samples will be overcompensated by the correction, thereby creating a ramp. The eighth measurement is taken after a time that is longer than the sample period and will, therefore, be under compensated. The result will be a 16 kHz/8=2 kHz sawtooth waveform superimposed on the phase signal. The peak to peak amplitude of the sawtooth will be 7/8*11*16 kHz/34 kHz=4.53 least significant bits. This may not be acceptable in many applications. The peak to peak amplitude of the sawtooth may, however, be reduced to half by measuring the phase on both the positive and negative zero crossings of the signal. This will also double the sawtooth frequency, but the output sample will then have to be corrected by 180 degrees, when latched on a negative zero crossing. One easy way to shift the phase 180 degrees is to invert the most significant bit of the output sample, i.e., adding −Pi in twos complement form.

Another problem of the above-described reference vector method is the asynchronous latching of the phase which demands the use of a Gray coded reference counter 11. If the reference clock state is to be used to obtain an extra bit of precision the trigger circuit 14 will have to be implemented asynchronously, unless of course a higher clock frequency than the reference clock is available. Asynchronous designs can be a nuisance.

Accordingly, there is a need for an improved phase digitizer which can provide a digital representation of an analog signal without the drawbacks associated with the above-described devices.

SUMMARY OF THE INVENTION

The present invention relates to an electronic device that directly generates a digital representation of an A.C. signal's instantaneous phase angle relative to a known reference signal. The digital representation is in modulo 2Pi format. The phase digitizer includes an accumulator that is responsive to a reference signal and a phase increment signal. Preferably, the phase digitizer includes a trigger circuit that is responsive to an input signal and a sample signal. The trigger circuit causes the phase value in the accumulator to be transferred to a holding latch upon a predetermined transition of the input signal, such as a zero crossing of the input signal. The value in the holding latch is transferred to an output latch, thereby providing a digital representation of the phase.

The frequencies of the reference signal, the sampling signal, and the input signal are not constrained, within practical limits, to have any particular relationship. Other features of the circuit are that it is independent of the sampling signal frequency and that the entire circuit may be built using digital logic elements. It is also possible to include a programmable register in the circuit to handle any input signal and reference signal frequency, within practical limits.

BRIEF DESCRIPTION OF THE DRAWINGS

FIG. 4 is a chart illustrating the operation of two half angle phase vectors;

FIG. 5 is a schematic diagram of a circuit for creating two half cycle phase values;

DETAILED DESCRIPTION OF THE INVENTION

The phase digitizer of the present invention is an improvement over the above-described direct phase digitizer of U.S. Pat. No. 5,089,669. The present invention, like the copending application, uses the same binary representation of the phase modulo 2Pi, and it may include a trigger circuit that is armed by a sample pulse and fired by an input signal zero crossing. The trigger circuit may, however, be omitted if a more economical version is desired.

Figure 2:
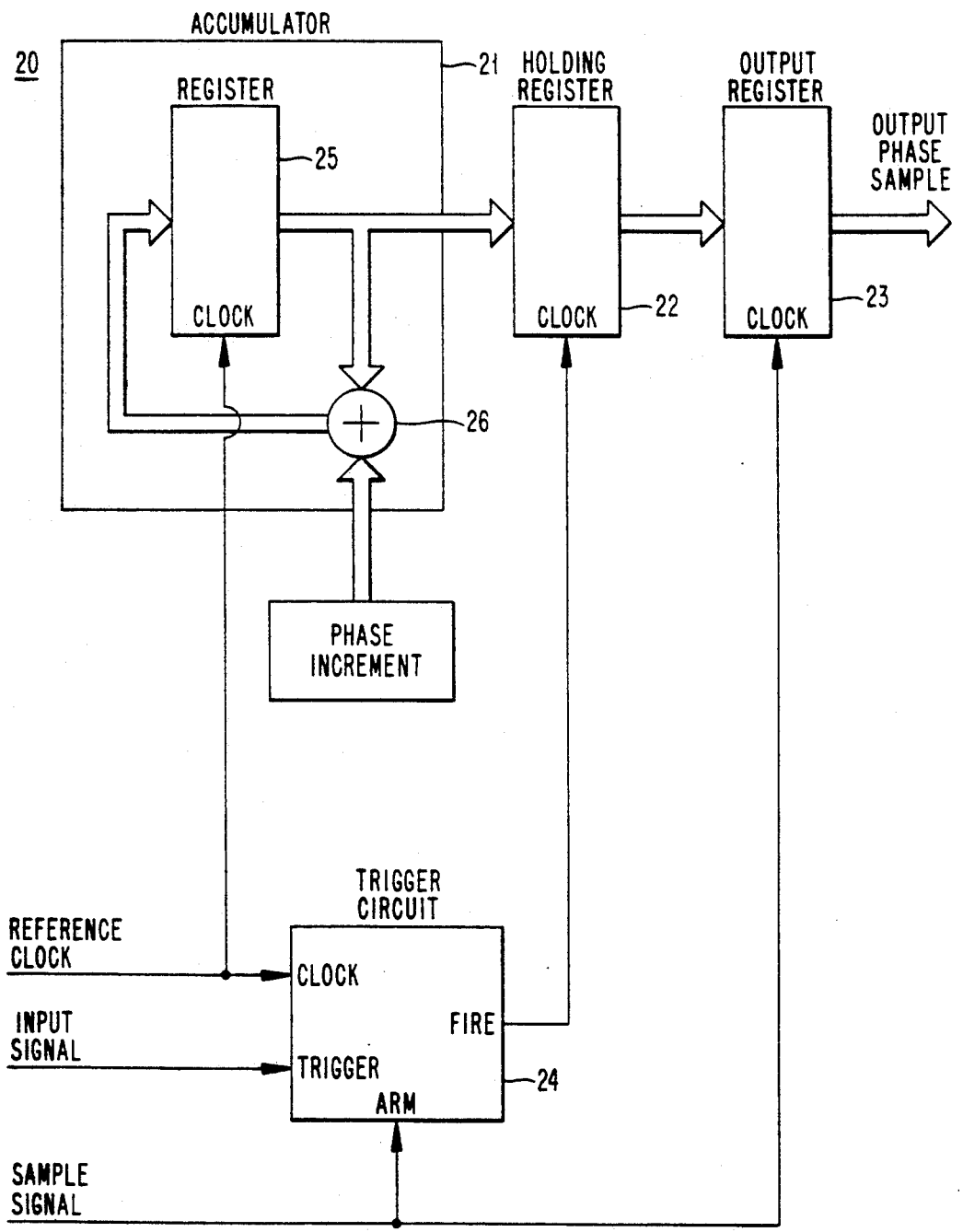
FIG. 2 is a schematic diagram of the accumulator phase digitizer of the present invention.

FIG. 2 shows a simplified block diagram of the accumulator phase digitizer 20 of the present invention. The main components of the present invention include the accumulator 21, the latches 22 and 23 and the trigger circuit 24. The accumulator 21 serves the same purpose as the reference counter divider of the copending application. The accumulator 21 holds the phase angle of a rotating reference vector in a latch 25. The output of the latch 25 is summed with a phase increment by a summer 26. The accumulator 21 is incremented by the phase increment once every reference clock cycle. Preferably, the phase increment is down loaded from a suitably programmed microprocessor. By adjusting the phase increment and the number of bits in the accumulator 21 it is possible to generate any phase vector, using any reference frequency, with arbitrary precision. The phase increment is determined only by the expected input and reference signal frequencies, thus the operation of the circuit 20 is completely independent of the sampling pulse, and it fires on the first zero crossing of the input signal. The strobe that the trigger circuit 24 generates when it fires transfers the accumulator value to a holding register or latch 22. On the next sampling pulse the value is transferred from the holding register 22 to the output register 23, thus the samples are generated at a regular interval determined by the external sampling signal.

The number of bits of the holding register 22 and output register 23 and the number of bits of the accumulator 21 do not necessarily have to be the same. It is possible to make an analogy between an ordinary analog-to-digital convertor and the phase digitizer 20. If the phase corresponds to the voltage at the analog-to-digital converter's input, then the phase accumulator 21 holds values that correspond to the quantization levels of the analog-to-digital converter and the phase increment corresponds to the quantization steps. If the width of the accumulator 21 is, for example, 16 bits and the phase increment is 10 bits, then it is really not necessary to know the full 16 bit representation of the quantization level since the quantization steps are so large. For example, you do not need to know the quantization levels with micro volt precision if they are several volts apart. Holding and output registers 22, 23 having eight bits should be sufficient.

The phase increment for a specific reference frequency and expected signal frequency can be calculated quite easily. For example, if the accumulator 21 is 16 bits wide it can represent integer numbers between 0 and 65535, wrapping around at 65536. The binary number 65536 then represents the phase angle 2Pi. For a 2 MHz clock frequency and a 34 kHz expected signal frequency, the increment is exactly 65536*34 kHz/2 Mh2=1114.112. It is not possible to represent this value exactly with a 16 bit integer increment, and the theoretically exact value has to be truncated to 1114. This introduces an error equivalent to a signal frequency offset of 34 kHz*1114/1114.112−34 kHz=3.4 Hz. In most cases a frequency error of this magnitude can be tolerated, but if this is not the case, then the width of the accumulator 21 will have to be increased. In this particular example it is possible to represent the increment exactly using a 36 bit accumulator.

The trigger circuit 24 is a significant portion of the phase digitizer 20. The latching of the phase accumulator 21 on the input signal's zero crossing and the use of the clock state to obtain extra precision of the phase word would normally require an asynchronous implementation, because the input signal zero crossing could occur at any time with respect to the clock. Thus, the phase accumulator 21 would have to be Gray coded, so that a latch strobe would not produce an erroneous result, if it occurred exactly at the same time as the incrementation of the accumulator 21, i.e., when the accumulator is read while incrementing. An asynchronous design is a significant problem for an ASIC designer, and if possible, an asynchronous design should be avoided. The trigger circuit 24 of the present invention transforms the unreliable behavior of an asynchronous design into a well behaved synchronous circuit, and in the process, it obviates the need for a Gray coded accumulator.

Figure 3:
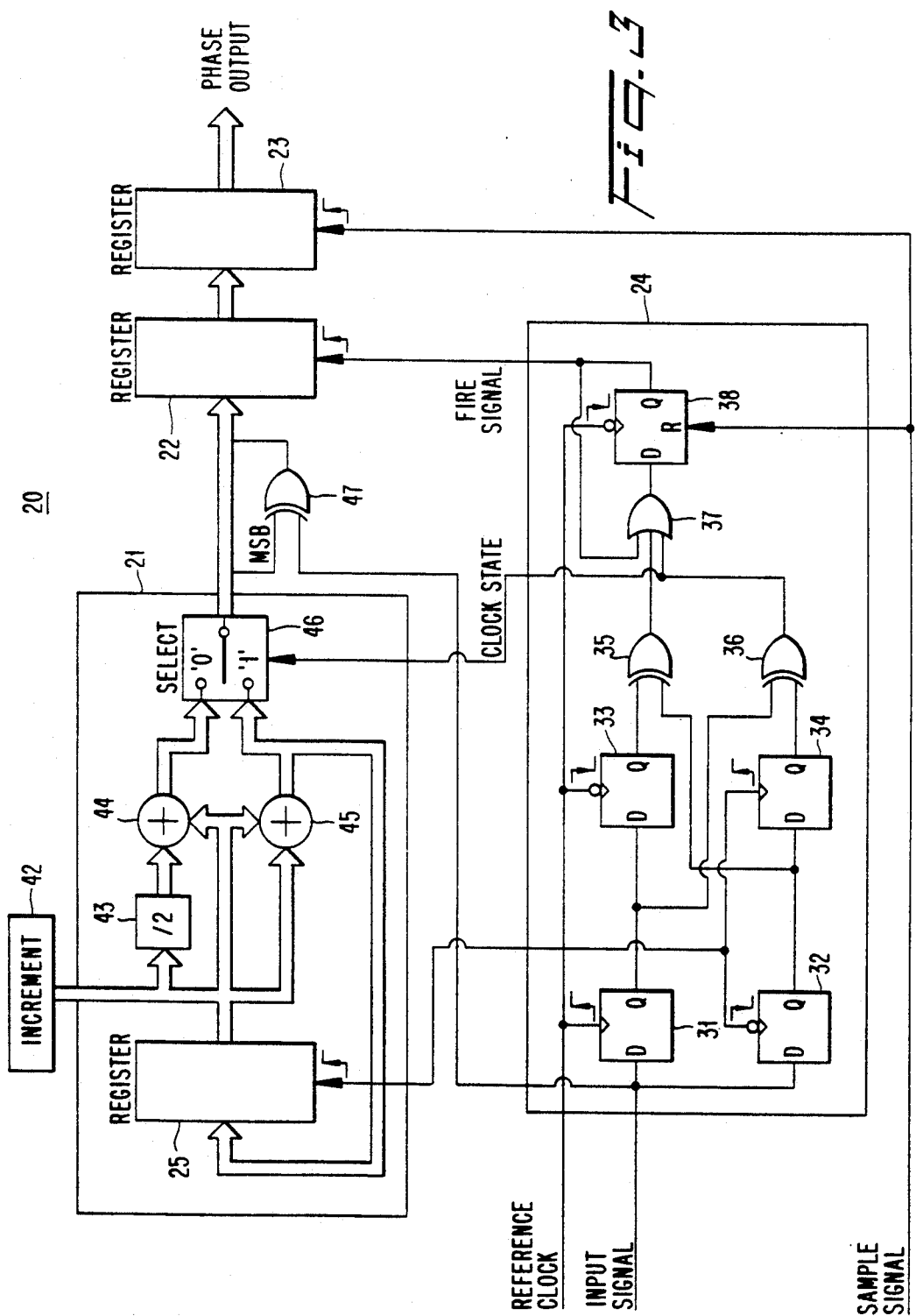
FIG. 3 is a schematic diagram of the phase digitizer of the present invention having a trigger circuit.

FIG. 3 shows a block diagram of the fully equipped phase digitizer 20, furnished with dual edge zero crossing triggering, clock state phase resolution enhancement, and programmable phase increment. In FIG. 3, the active clock edge of the edge triggered devices has been indicated by an arrow. For the clock state resolution enhancement to operate correctly two phase accumulator values have to be calculated, one value for the positive clock cycle state and the second value for the negative clock cycle state. This can be accomplished by adding only half the phase increment stored in register 42 to the accumulator value stored in register 25 to calculate the positive state cycle value. It is very easy to divide the phase increment in register 42 by two with a divider 43, since this is equivalent to a one bit position binary right shift. The output of the divider 43 is summed with the output of the register 25 by a summer 44. The output of register 42 is also summed with the output of the register 25 by a summer 45. The two values from summers 44 and 45 are applied to a selection switching device 46 which transfers the selected value to the holding register 22. The exclusive OR gate 47 inverts the most significant bit of the phase word when a measurement is taken on a positive input signal edge, thus providing the necessary 180 degrees of phase shift between positive and negative transition triggered measurements.

The two phase values of the accumulater 21 are calculated once every clock cycle and the calculations are synchronous with the clock. The trigger circuit 24 remembers during which clock state the zero crossing occurred. Between 0.5 to 1.5 clock cycles after the input signal zero crossing occurred and on a negative clock edge, the state of the input signal is sampled to determine if it was a positive or negative zero crossing that fired the trigger circuit 24. This means that the input signal must be stable at least 1.5 clock cycles after a zero crossing or the measurement may be corrupted. However, zero crossings occurring just a few clock cycles after one another mean that the signal itself is corrupted so that there is really no problem. The trigger circuit 24 selects the correct phase value (positive or negative cycle) depending on the trigger instant clock state, corrects the phase value by 180 degrees if it was a negative zero crossing that fired the trigger, and 0.5 to 1.5 clock cycles later the measurement is transferred to the holding latch 22. The next sampling pulse latches the measurement in the output latch 23. Thus, samples occur at the output latch 23 with a one sample delay at an interval determined by the externally applied sampling signal.

The trigger circuit 24 generates two signals, a fire signal that loads the accumulator phase value into the register or holding latch 22 and a clock state signal indicating the state of the reference clock the moment the input signal zero crossing occurs. The clock state signal is used by the switching device 46 to select whether the full or the half cycle phase value from the accumulator 21 should be used.

The trigger circuit 24 includes four D type flip-flops 31-34, clocked by the reference clock, and two exclusive OR gates 35, 36 to determine when an input signal transition occurs and the reference clock state at the transition instant. Two of the D type flip-flops 31, 34 are positive edge triggered, and two of D type flip-flops 32, 33 are negative edge triggered. Of the two positive edge triggered D type flip-flops 31, 34, D type flip-flop 31 is fed the input signal directly, and the D type flip-flop 34 is fed the input signal delayed one half reference clock cycle by the negative edge triggered D type flip-flop 32. Thus, if the input signal transition occurs on a positive reference clock half cycle, both outputs of the positive edge triggered flip-flops 31, 34 will change simultaneously on the next positive reference clock edge. If the input signal transition occurs on a negative clock half cycle, only the output of the flip-flop 31 with a non-delayed input will change. This means that an input signal transition during a negative reference clock half cycle can easily be detected by the means of the XOR gate 36 sensing differences between the outputs of the two positive edge triggered flip-flop 31, 34. The trigger circuit 24 is symmetric with exactly the same arrangement of negative edge triggered flip-flops 32 33. A transition occurring on a positive half cycle can be detected the same way from the outputs of the negative edge triggered flip-flops 32, 33. Every input signal transition will generate a one reference clock cycle long logic high pulse on one of the outputs of XOR gates 35, 36. The output appears on the XOR gate 35, 36 depending upon the reference clock half cycle in which the transition occurs. The output indicating a negative half cycle transition is used to select the full cycle phase value.

The outputs of XOR gate 35, 36 are ORed together by an OR gate 37 and fed to a D flip-flop 38. If either of the outputs of XOR gates 35, 36 goes high, the D type flip-flop 38 will generate an active fire pulse on the next negative reference clock edge. Because the fire signal is fed back to the OR gate 37, the signal will remain active until the D type flip-flop 38 is reset by a sample signal pulse. The sample pulse also loads the new phase value into the output register or output latch 23. While the sample signal is active, the trigger circuit 24 is reset and is inhibited from generating a new fire pulse. This means that the sample pulse must be inactive for at least one half input signal period to make sure a new measurement will be made.

If the phase increment is implemented as a programmable register 42, instead of a hard-wired bit combination, then the phase digitizer 20 can be programmed to operate with almost any reference and input frequency without changing the hardware.

The quantization steps of the phase digitizer 20 are determined by the reference clock frequency. A higher clock frequency results in smaller quantization steps. Since the quantization introduces distortion, it is desirable to keep it as small as possible. The easiest way to accomplish this objective is to increase the clock frequency. It is also possible to use the state of the clock i.e., positive or negative clock half cycle, to double the resolution. The clock will then have to be a square wave with 50% duty cycle. There are at least two possible ways to implement this arrangement. FIG. 4 and FIG. 5 each show a block diagram of a method for implementing this arrangement. The method shown in FIG. 5 is the preferred one, but the principles of operation are common to both. Instead of calculating one new accumulator phase value each clock cycle, two values are calculated, one for each half cycle. The phase value chosen depends on whether the zero crossing occurred during a positive or a negative clock half-cycle.

If, for example, only the positive input signal zero crossing is used to latch a phase measurement, then the time between the sampling pulse and the actual measurement may vary from zero to one input signal cycle. If the input signal frequency exactly matches the expected input signal frequency, this is of no importance. When the input signal is frequency modulated, it becomes more important as the frequency deviation increases. When the signal is modulated, the frequency deviation creates a phase ramp that is sampled at the first input signal zero crossing occurring after a sampling pulse. This introduces jitter at the sampling time point that results in an output phase jitter, since it is a ramp that is being sampled. This time/phase jitter can be reduced by half using both zero crossings. However, the output phase will have to be corrected by 180 degrees when a sample is acquired on a negative zero crossing. The easiest way to do this is to invert the most significant bit of the output phase sample.

Figure 6:
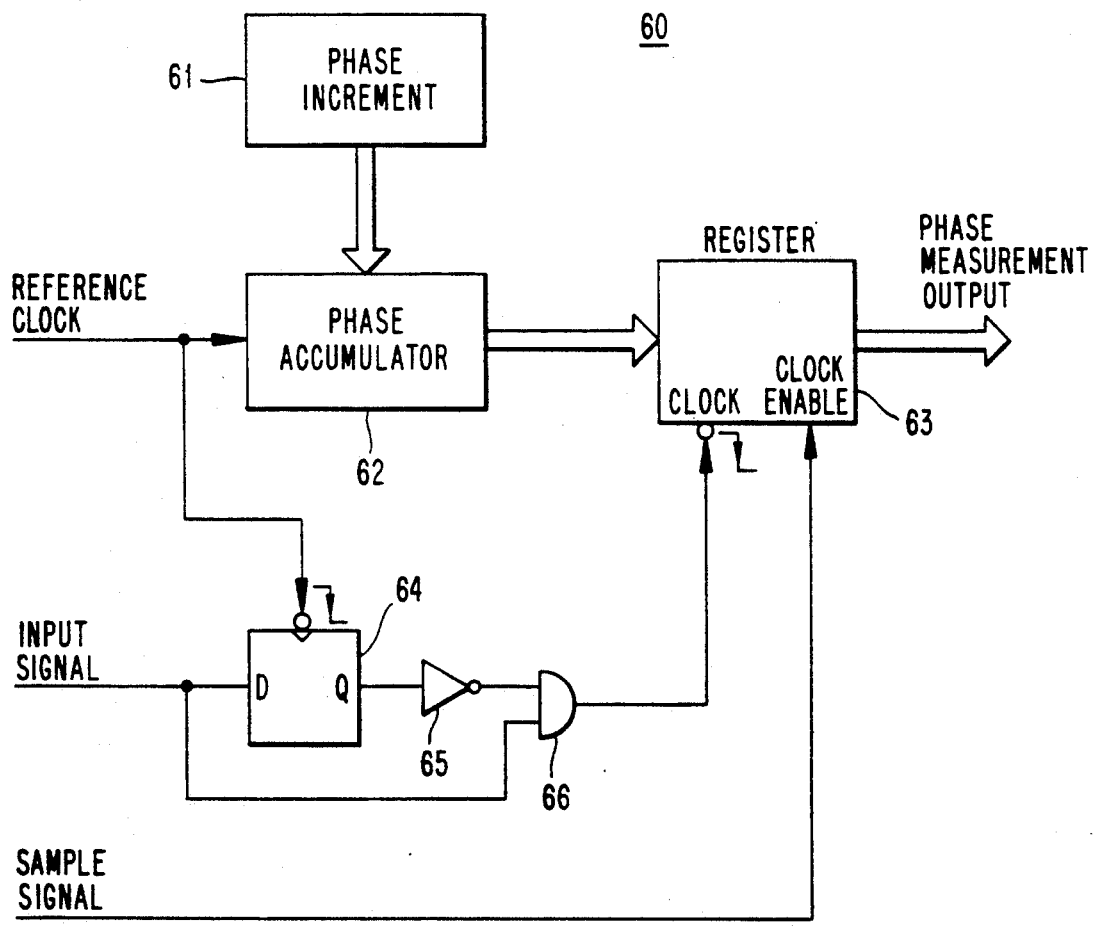
FIG. 6 is a schematic diagram of a simplified phase digitizer.

A more economical phase digitizer 60 can be implemented without an arm/fire trigger circuit 24 in order to keep the design as simple as possible. FIG. 6 shows the block diagram of the simplified phase digitizer 60. The simplified phase digitizer 60 includes a phase increment register 61, a phase accumulator 62, a latch 63, a D type flip-flop 64, an inverter 65, and an AND gate 66. When the sampling signal is inactive (high) every positive input signal edge transfers a new phase value into the latch 63. The latching is synchronized to the clock, thus obviating the need for a Gray coded accumulator. An active low sampling signal simply inhibits the latching of another sample by pulling the clock enable input of the latch 63 low, thus producing a stable output measurement.

A limitation associated with the phase accumulator of the present invention is that incrementing the phase accumulator at high frequencies consumes a substantial amount of power. This is due to the incrementation which involves an addition of two relatively wide binary words, the increment and the accumulated phase. In a CMOS chip the power consumption at a fixed clock frequency is mainly dependent on two things, the clock source load capacitance and the number of bits that change state every clock cycle and their load. There is not much that can be done about the load capacitances, but the number of bits changing states can be reduced. Assume, for example, that on average about half of all output bits of the accumulator changes states after one incrementation which is only a rough estimation. The actual number of bits that changes states is of course dependent on the accumulator and increment values. If a binary counter were to be used instead of the accumulator, then on average only two bits (maximum) would change per clock cycle. Preliminary calculations show that it would be possible to save about 65% of the current consumption by using counters instead of an incrementing accumulator.

Figure 1:
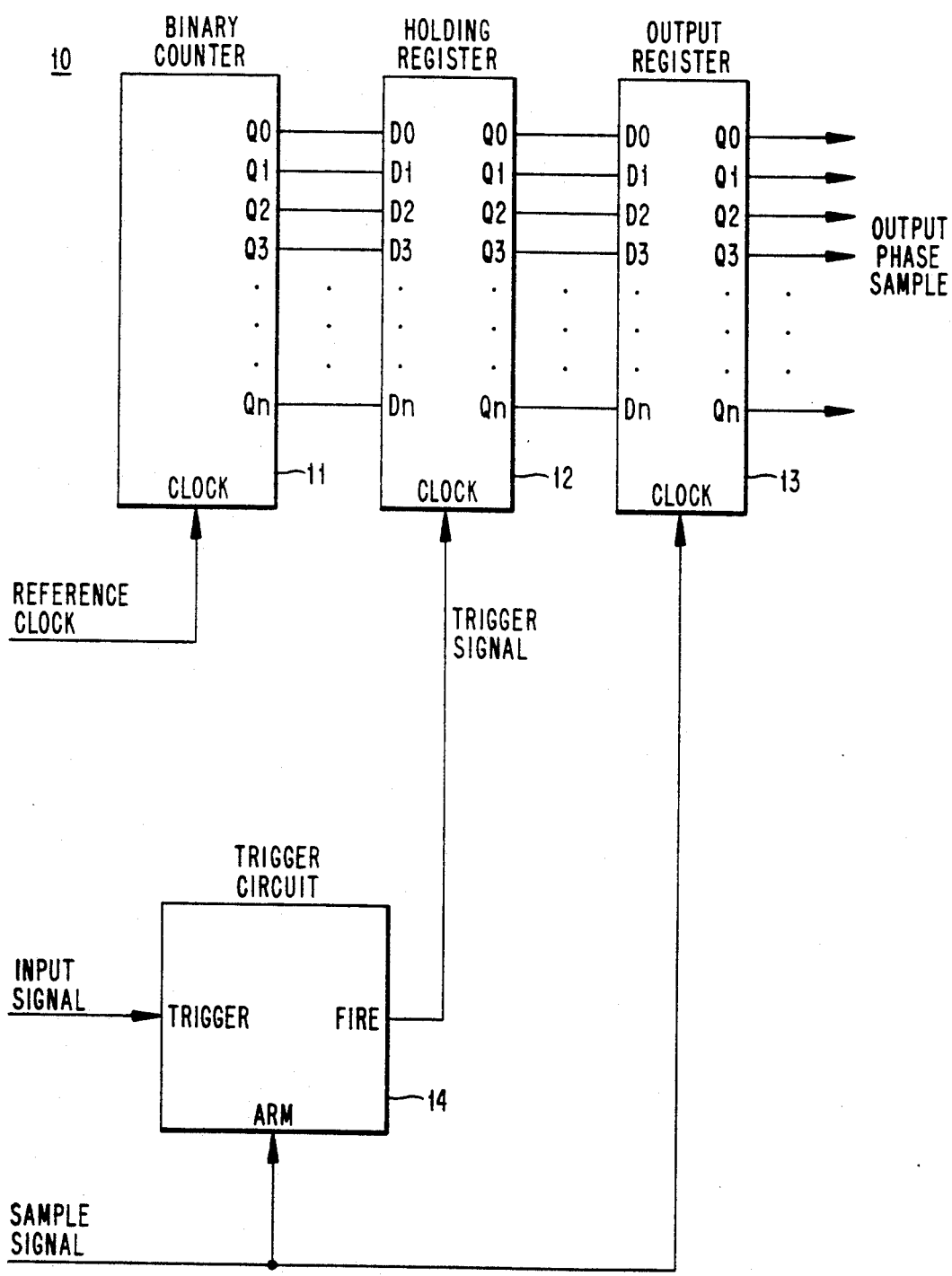
FIG. 1 is a schematic diagram of a reference vector phase digitizer.
Figure 7:
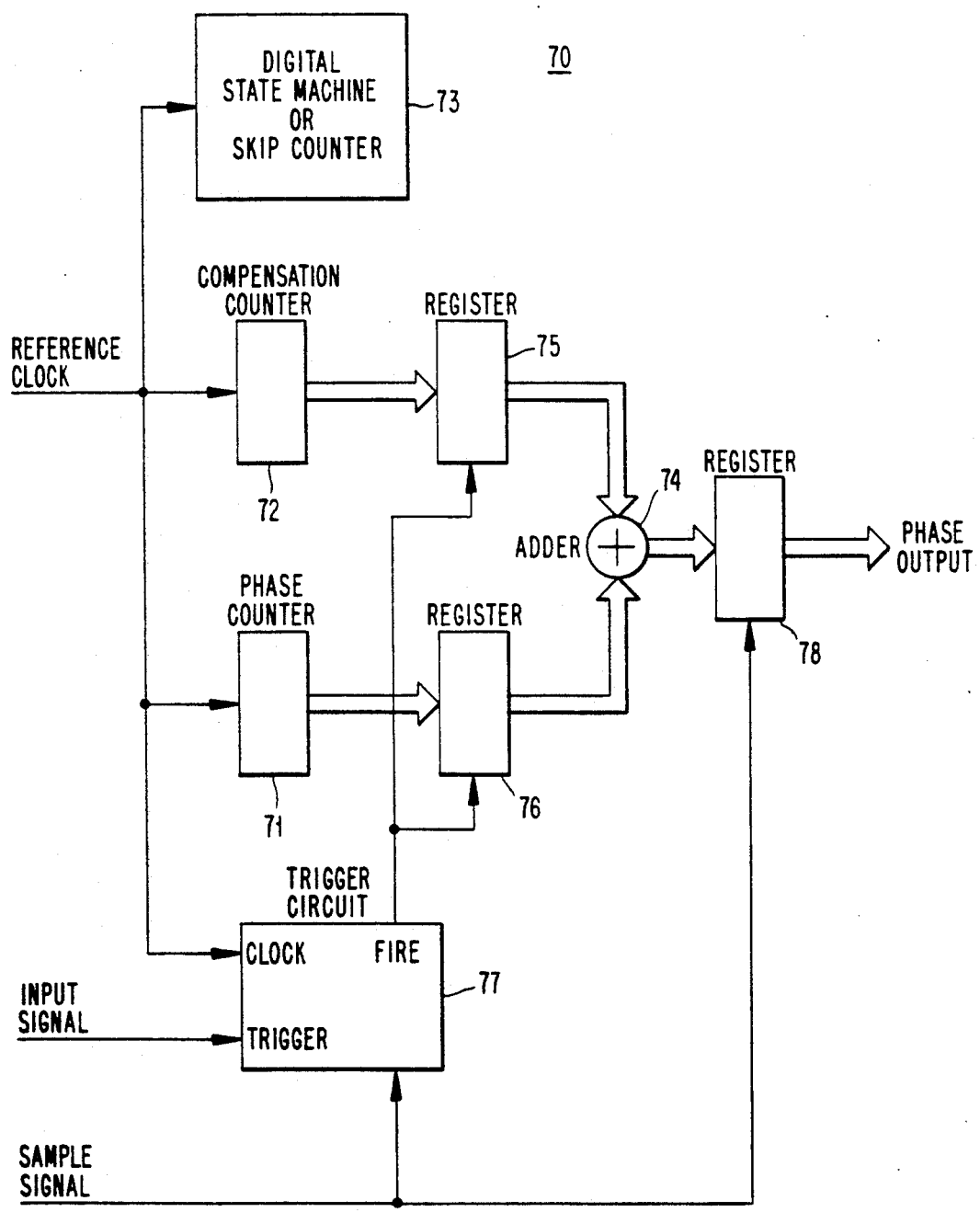
FIG. 7 is a schematic diagram of a low power phase digitizer having counters.

FIG. 7 shows how a phase digitizer 70 of the present invention could be implemented using counters. A main counter 71 is incremented by a reference clock signal, thus creating a rotating phase vector. The reference frequency signal is also applied to a compensation counter 72. The compensation counter 72 holds an integrated frequency offset. The clock pulses to the error compensation counter 72 may be generated by a circuit 73 which could include a divider, a finite state machine, a skip counter or another reference clock signal, if available. To generate the correct phase, the state of the main counter 71 and the compensation counter 72 are transferred to latches 75, 76 in response to a signal generated by a trigger circuit 77. The outputs of the latches 75, 76 are summed together by a summer 74, but this only needs to be done once for every sample. The output of the summer 74 is applied to an output latch 78 which is also responsive to the sample pulse. Since the sampling frequency is substantially lower than the reference frequency, the power saving will be a considerable. There is one major difference between the apparatus of FIG. 7 and the apparatus of FIG. 1. The major difference is that both the compensation counter 72 and the phase counter 71 are read on the zero crossing of the input signal (i.e. the compensation is based on the actual time between measurements, not on the sampling interval).

For example, if the expected input signal frequency is 34 kHz and the reference clock frequency is 2 MHz then a 6 bit binary phase counter, wrapping around at 64, would be chosen because 2 MHz/34 kHz=58.8 which is close to 64. An error compensation counter would then have to be introduced to compensate for the difference between the repetition rate of the phase counter 71 and the expected input signal frequency. The difference is 34 kHz−2 MHz/64=2750 Hz which means that the compensation counter 72 should have a cycle repetition rate of 2750 Hz. The number of bits in the compensation counter 72 should be as high as possible to keep the quantization error low, but the maximum number of bits is limited by the fact that the compensation counter 72 must wrap around 2750 times per second using a clock frequency derived from the main clock. An eight bit counter is a good compromise in this case, because it does not have too many bits and its quantization error is only one fourth that of the phase counter 71. The clock frequency of the compensation counter 72 should be 256*2750 Hz=704 kHz. It is not possible to obtain this frequency from the main clock using a simple divider. If the compensation counter 72 is incremented once every third main clock period and one additional time after every 18 increments, then the total number of increments per second will be approximately correct. In this particular case it is not possible to generate the exact number of increments by this simple method, but the frequency error of the generated phase ramp will be very small, e.g., −1.16 Hz.

Figure 8:
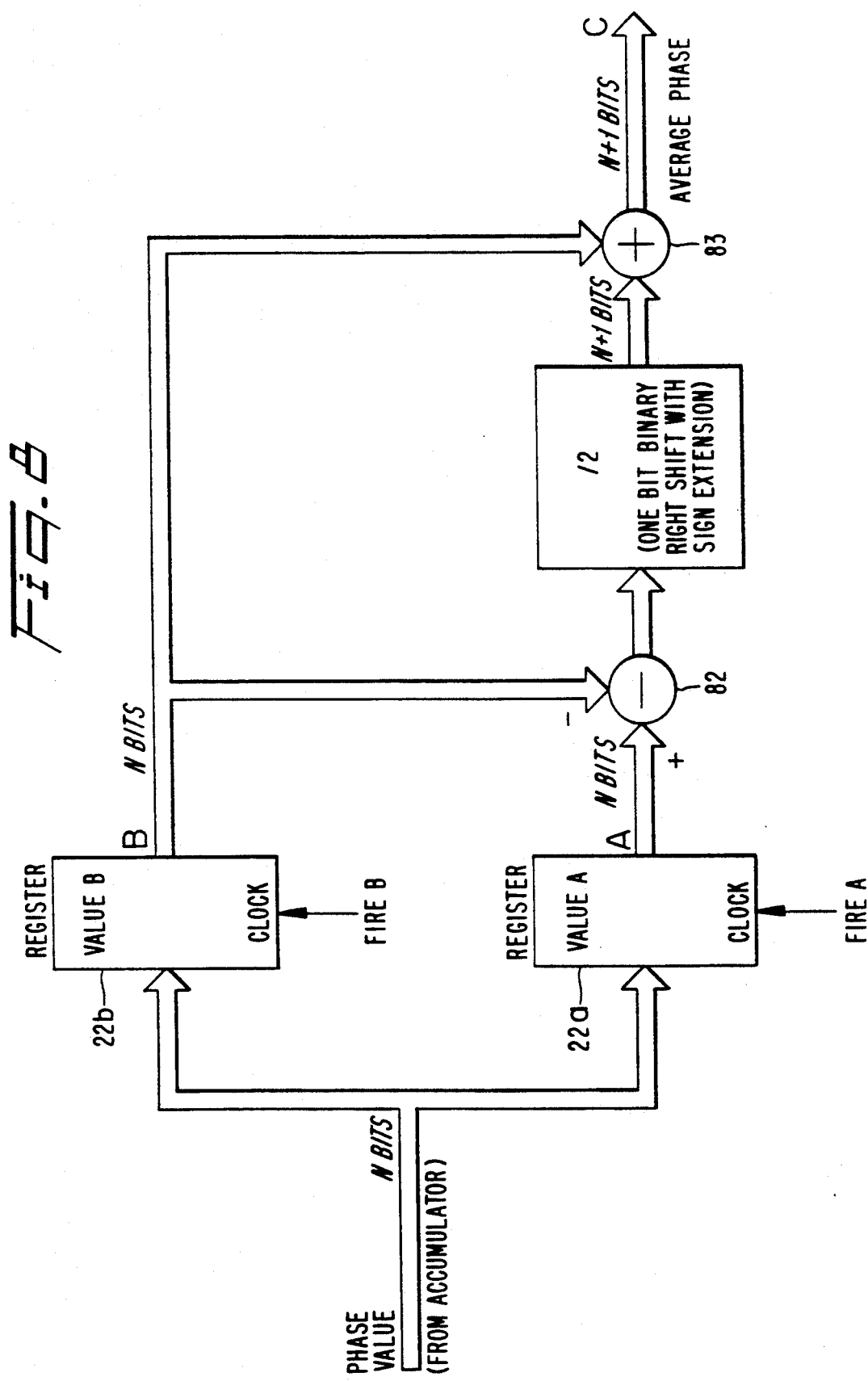
FIG. 8 is a block diagram of the circuitry used to calculate the phase vector average of two phase measurements.

It should be pointed out that input signals may not always have exactly 50 percent duty cycle. When using a trigger circuit 24 of the type illustrated in FIG. 3 that fires on both input signal zero crossings, this becomes a problem. For example, if the input signal duty cycle is 40 percent, the phase measurements taken on a positive zero crossing will differ from the measurement taken on a negative zero crossing by 10 percent, or 36 degrees at the nominal input signal frequency. In many applications this is not acceptable. The solution is to always make two measurements for every output phase sample, one on a negative zero crossing and one on a positive, and then calculate the output sample as the vector average of the two measurements. This requires a modification of the trigger circuit 24. FIG. 8 shows a block diagram of the modification. The preferred modification includes registers 22a and 22b to replace register 22 and two binary adders 82, 83 to perform the calculation. If A and B are the two measured phase angles and C is the output sample, then angle C is calculated as $C = (((A-B)/2) \mod Pi + B) \mod 2*Pi$, where mod is the modulo operator. Because of the chosen binary representation of the phase this calculation becomes very simple when implemented using binary adders. The circuitry shown in FIG. 8 is intended to replace register 22 and to be inserted before the output register 2 of the phase digitizer 20 of FIG. 3.

Since register 22a holds the value from the first measurement A and the register 22b holds the second measurement B, when the second value B becomes available, the calculation is performed. The mod operation is "automatic" because of the number of bits used in the calculation. For example, if the input phase measurement values, A and B, are 8 bits wide, then the result of the subtraction is also an 8 bit value, representing a phase of 0 to 2*Pi. The one bit binary right shift with sign extension performs both the divide by 2 and the mod Pi operations. The result of the right shift is a 9 bit binary value which is added to the B value giving a 9 bit output result. By simply ignoring the carry from the adder 83 an output result in the range of 0 . . . 2*Pi is obtained.

Figure 9:
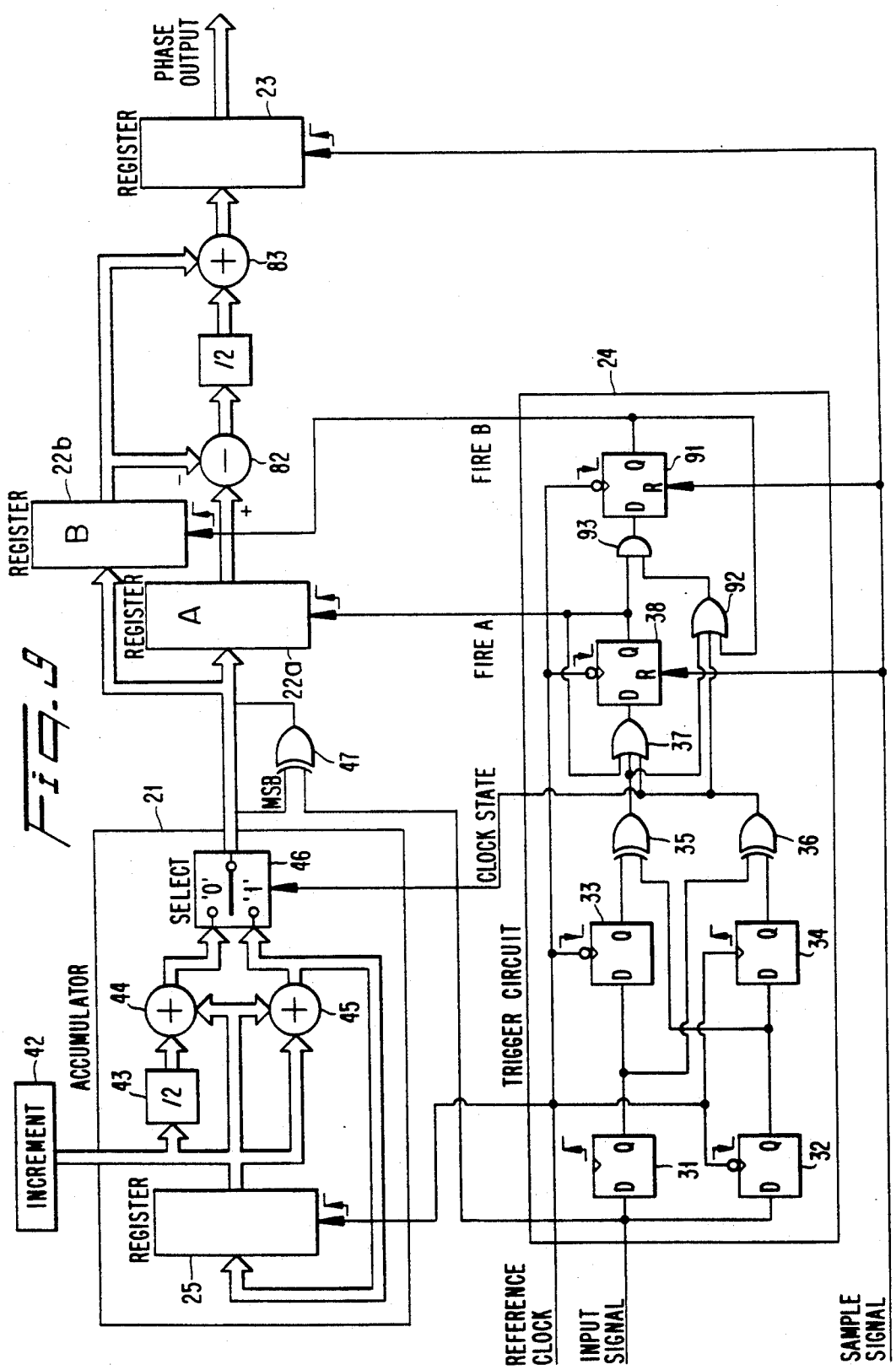
FIG. 9 is a block diagram of the phase digitizer which can perform the average calculations of FIG. 8.

FIG. 9 shows a block diagram of the complete phase digitizer 90 with modifications made to the trigger circuit 24 to generate the extra fire signal necessary to perform the average calculation of FIG. 8. The operation of the modified trigger circuit is almost identical to the unmodified circuit of FIG. 3. The only changes are OR gate 93, AND gate 93 and an extra D flip-flop 91 whose output fires on the second input signal zero crossing after the sample pulse, thus loading the second measurement B into the register 22b. It is also possible to obtain one extra bit of phase precision using the average method illustrate in FIG. 8.

I claim:

1. A circuit for determining at predetermined intervals, a digital value representative of the instantaneous phase of an input signal relative to a reference signal, said circuit comprising:
   a digital accumulating means, responsive to the reference signal that is incremented or decremented by a predetermined value upon each of the reference signal cycles to produce an accumulating value;
   triggering means responsive to a sampling signal and said input signal for generating a firing pulse;
   holding register means for recording said accumulating value upon occurrence of said firing pulse; and
   output means responsive to said sampling signal for outputting said holding register contents at said predetermined sampling intervals.

2. A circuit according to claim 1 wherein said trigger circuit includes an arm input for receiving the sampling signal and a trigger input for receiving the input signal, such that a fire pulse is generated in response to the transition in the input signal, thereby causing the transfer of the accumulating value of the digital accumulating means to the holding means.

3. An electrical circuit according to claim 2 which further includes differentiating means for converting a sequence of digital phase values to a sequence of frequency estimates.

4. A circuit according to claim 1 wherein said digital accumulating means includes means for calculating at least two accumulating values, one accumulating value for each reference signal half cycle, and said trigger circuit selects the correct accumulating value depending upon the state of the reference signal at a transition of the input signal, wherein the resolution is doubled.

5. A circuit according to claim 1 which is responsive to more than one transition of the input signal per input signal period to generate the firing pulse which causes latching of the accumulating value into the holding means, and which further includes means for compensating the accumulating value by adding or subtracting an offset corresponding to an actual trigger event relative to a standard trigger event.

6. A circuit according to claim 1 wherein said digital accumulating means includes binary counting means, which is read on the same transition of the input signal, for adding or subtracting compensation values together with the accumulating values.

7. A circuit according to claim 1 wherein said digital accumulating means includes a main counter and a compensation counter; and
   said holding register means includes two reading means, a first means for reading said main counter and a second means for reading said compensation counter.

* * * * *